United States Patent [19]

Trefney

[11] 4,070,619
[45] Jan. 24, 1978

[54] MICROSTRIP CONFIGURATION WITH INDUCTIVE PICKUP LOOP FOR VSWR METER

[75] Inventor: Ralph P. Trefney, Valley View, Ohio
[73] Assignee: Bird Electronic Corporation, Solon, Ohio
[21] Appl. No.: 768,078
[22] Filed: Feb. 14, 1977
[51] Int. Cl.² ............................................. G01R 27/04
[52] U.S. Cl. ..................................... 324/95; 324/58 B
[58] Field of Search ...................... 324/95, 58 B, 58 R; 333/7 R, 10; 325/67, 133, 363

[56] References Cited

U.S. PATENT DOCUMENTS

| | | | |
|---|---|---|---|
| 3,683,274 | 8/1972 | Martin | 324/95 X |
| 3,784,911 | 1/1974 | Ramstrom | 324/95 |
| 3,829,770 | 8/1974 | Stevens | 324/95 |
| 3,848,189 | 11/1974 | Pope | 324/95 |
| 4,034,289 | 7/1977 | Rozylowicz et al. | 324/95 |

Primary Examiner—Stanley T. Krawczewicz
Attorney, Agent, or Firm—Bosworth, Sessions & McCoy

[57] ABSTRACT

A VSWR meter unit for detecting and measuring the forward and reflected RF voltage wave signals on a coaxial transmission line. The unit is adapted to be electrically inserted in a tubular or coaxial transmission line, having an outer conductor with a coaxial center conductor therein. A microstrip circuit board is provided within the meter unit and comprises a dielectric board with a ground plane conductor printed on one side and inserted across the outer conductor, and a specially designed conductive path printed on the other side and inserted across the inner conductor. Also printed on the other side of the microstrip board is an inductive sensing loop located within and concentric with a circular loop portion of the conductive path. The sensing loop is closely spaced to the loop portion of the conductive path so as to be responsive to the voltage wave signal on the transmission line. A D'Arsonval meter movement is connected to the conductive loop through a specially designed 180° switch assembly in either a "forward" or "reflected" condition through a meter circuit, designed so that the meter provides an indication of the level of either the forward voltage wave signal or the reflected wave signal depending on the condition of the switch assembly.

3 Claims, 8 Drawing Figures

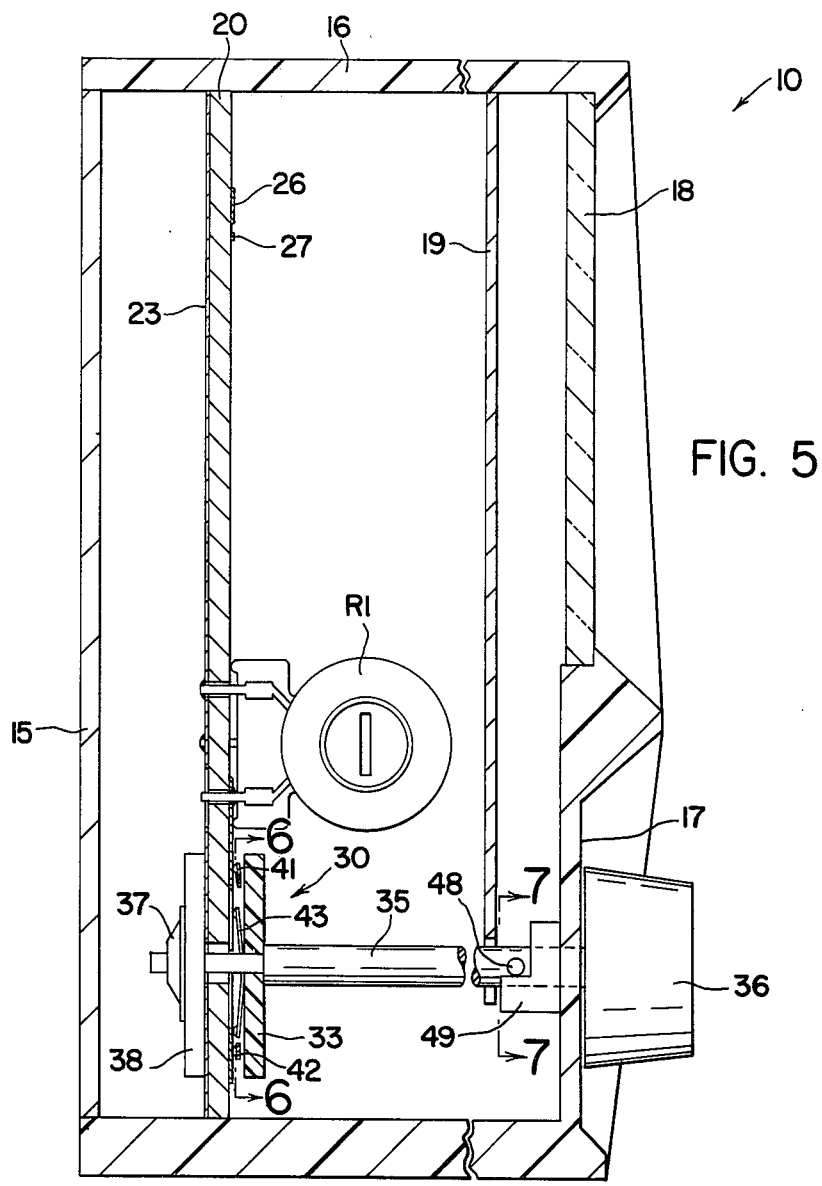
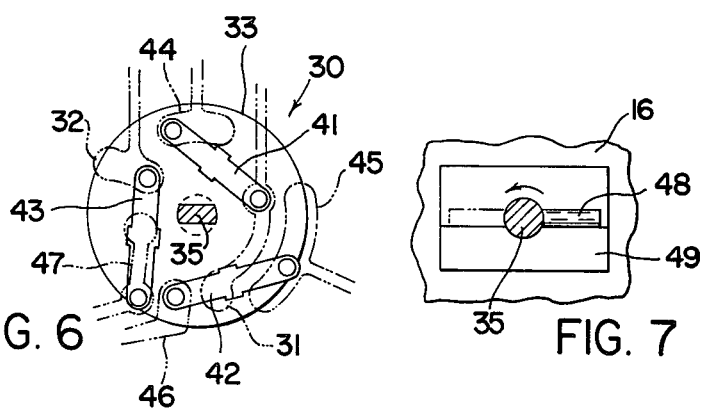

MICROSTRIP CONFIGURATION WITH INDUCTIVE PICKUP LOOP FOR VSWR METER

BACKGROUND OF THE INVENTION

This invention relates to electronic instruments for detecting and measuring RF voltage wave signals on coaxial transmission lines, such as between a transmitting antenna and a transmitter. More particularly, the invention relates to an "insertion-type" RF directional wattmeter for detecting and measuring both the forward and reflected voltage wave signals on a coaxial transmission line.

Insertion-type RF directional wattmeters are used in many applications in the RF field, particularly, in matching antennas to coaxial transmission lines and in minimizing the voltage standing wave ration (VSWR) on the coaxial line. One application that is becoming increasingly important is in connection with CB transmitters that are currently so popular in the United States for use in automotive vehicles. These installations require accurate impedance matching in view of the limited power permitted.

Meters currently available for this application are, for example, of the type disclosed in U.S. Pat. Nos. 2,852,741 and 2,891,221 and in copending U.S. patent applications Ser. Nos. 719,565 and 738,476.

In these units, a rigid coaxial line section is inserted in the coaxial transmission line, such as by standard coaxial connectors, and an inductive pickup coil positioned in a transverse opening in the outer conductor of the line section is adapted for rotation about an axis normal to the axis of the line section. The pickup coil is connected by special leads to a D'Arsonval meter movement and the resulting meter reading indicates the magnitude of the wave signal in watts, the indication being either that of the magnitude of the forward voltage wave level or the reflected voltage wave level depending upon the particular orientation of the pickup coil.

The pickup coil is located in the electrical field between the inner and outer conductors of a coaxial transmission line and has a voltage induced therein proportional to the current I in the inner conductor, there being a mutual inductance M between the loop and the transmission line and the loop being positioned in the plane of the inner conductor of the line. A series circuit of resistance R and capacitance C connected across the transmission line conductors will give a voltage across the resistance R proportional to the voltage E between the line conductors. In directional couplers and so-called reflectometers, the arrangements mentioned are combined in a sampling circuit in which the resistor R is connected in series with the loop and capacitive coupling is provided as by capacitive plates or windings on the loop and the inner conductor or by capacitive effects between the components of the sampling circuit and the inner conductor.

Considering the sampling circuit mentioned and using lumped impedances, it is apparent that M is either positive or negative depending upon the directional relation between the loop and the wave signal energy traveling on the line.

The instrument described obtains reversal of the mutual inductance M through 180° rotation of the loop relative to the transmission line. The forward traveling wave has voltage $E_f$ and current $I_f$ while the reflected traveling wave has voltage $E_r$ and current $I_r$. Thus, if $Z_o$ be the characteristic, impedance of the line and the reflection coefficient:

$$p = E_r/E_f = I_r/I_f$$

and $$e = jw(CRE + MI) = jwe_f[CR(1+p) + (M/Z_o)(1-p)]$$

where $e$ is the total electromotive force induced in the loop or sampling circuit. The components are selected so that:

$$RC = \frac{M}{Z_o} = K$$

K being a constant. If we let $e$ be the electromotive force when M is positive so that the voltage across R and the voltage induced in the loop are additive, and let $e$- be the electromotive force when M is negative and the voltages referred to are opposed, the former gives a maximum and the latter a minimum indication, thus:

$$e = jwE_f[K(1+p) + K(1-p)] = 2jwE_fK$$
$$e\text{-} = jwE_f[K(1+p) - K(1-p)] = 2jwE_fKp$$

from which the reflection coefficient and standing wave ratio can be obtained.

The prior art instruments referred to above have generally required that the coil be physically inserted in a line section of suitable size and that it be rotatable through 180° of travel in the field between the outer conductor and inner conductor of the line section in order to sense the magnitude of both the forward voltage wave level and the reflected voltage wave level. This necessarily requires a fairly large meter construction and a fairly complex and costly mechanical assembly to support and provide for proper rotation of the coil.

Accordingly, many prior art instruments of this type are large in size and awkward to use where space is limited, such as in the case of CB units installed in automotive vehicles.

The instrument of the present invention avoids the difficulty indicated above and affords other features and advantages heretofore not obtainable.

SUMMARY OF THE INVENTION

It is among the objects of the invention to provide an improved RF VSWR meter circuit design for an electronic instrument for detecting and measuring the forward and reflected RF voltage signals on a coaxial transmission line.

Another object is to provide an electronic instrument of the type described of lower cost construction and of reduced physical size.

Still another object is to eliminate the complex mechanism required in electronic instruments of the type described for rotating an inductive pickup coil in the field between the inner and outer conductors of a coaxial line section.

These and other objects and advantages are achieved with the unique RF VSWR meter circuit design of the invention.

The instrument in which the novel meter circuit design is used includes as conventional elements a D'Arsonval meter movement that indicates directional RF voltage wave signals on a coaxial transmission line having a tubular outer conductor and a coaxial inner conductor, the outer conductor being in electrical contact with a conductive base member which supports the various electrical components of the instrument.

In accordance with the invention, the base supports a microstrip board with a flat base formed of dielectric material and with a ground plane conductive layer coated on one surface thereof and in electrical contact with the base member. On the opposite surface of the microstrip board is a conductive path of unique form connected at its opposite ends to the respective ends of the coaxial center conductor. The dielectric material of which the base is comprised provides a predetermined matching impedance between the ground plane layer and the conductive path, such as, for example, about 50 ohms in the typical situation. The conductive path has a circular loop portion formed therein and an inductive sensing loop is printed on the base within and concentric with the circular loop portion. The sensing loop is closely spaced from and symmetrical with the circular loop portion so as to be responsive to the RF voltage standing wave on the transmission line.

The inductive sensing loop is connected to a D'Arsonval meter movement through a specially designed 180° rotary switch assembly in either a "forward" or "reflected" condition through a meter circuit so that the meter movement gives a visual indication representative of either the forward or reflected voltage wave signal on the transmission line. When the switch assembly is in the "reflected" condition, it also sets the meter circuit to a condition that affords increased meter sensitivity and better resolution.

Accordingly, the deflection of the meter of the D'Arsonval meter movement is a function of an induced RF voltage level sensed by the inductive sensing loop and represents either the forward voltage signal or the reflected voltage wave signal on the transmission line depending on the position of the 180° rotary switch assembly.

BRIEF DESCRIPTION OF THE DRAWINGS

FIG. 5 is a broken sectional view on an enlarged scale taken on the line 5—5 of FIG. 2;

FIG. 6 is a fragmentary sectional view taken on the line 6—6 of FIG. 5;

FIG. 7 is a fragmentary sectional view taken on the line 7—7 of FIG. 5; and

DESCRIPTION OF THE PREFERRED EMBODIMENT

Figure 1:
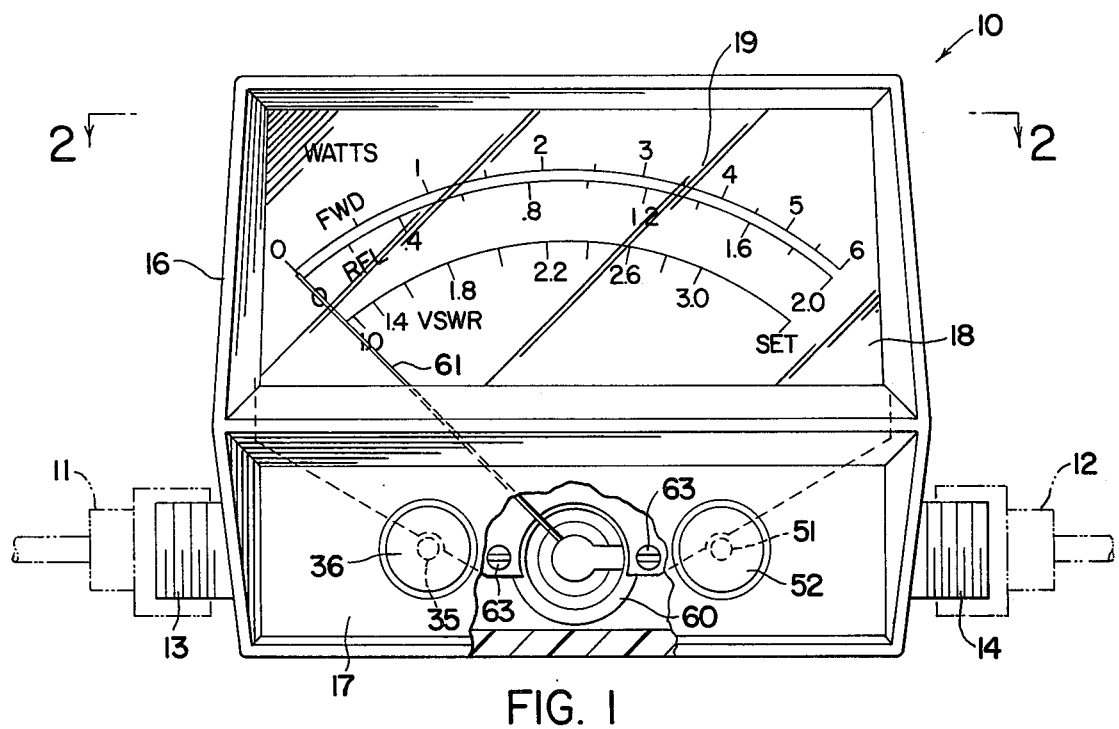
FIG. 1 is an elevational view of an electronic instrument with parts broken away and shown in section, for detecting and measuring the forward and reflected RF voltage wave signals on a coaxial transmission line and having a microstrip-type circuit board embodying the invention.

Referring more particularly to the Drawings, there is shown an RF directional wattmeter 10 typical of the type in which an RF VSWR meter circuit of the invention is used, and adapted for detecting and measuring the forward and reflected RF voltage wave signals on an RF coaxial transmission line. The ends 11 and 12 of the coaxial cable between which the instrument 10 is inserted have standard coaxial connectors 13 and 14 shown in dash lines in FIG. 1 that are connected to the instrument 10. The instrument has a conductive metal base 15 that supports the various electrical components and a housing 16 secured to the base 15 and formed of nonconductive molded material. The housing 16 supports a front panel 17 and a protective transparent window element 18 that, in turn, protects a meter scale plate 19.

The instrument 10 has as basic components a microstrip circuit board 20 with associated circuit components and a D'Arsonval meter movement assembly 60. The microstrip board 20 has a base formed of dielectric material, such as that identified by the trade designation "P.C.75", manufactured by The General Electric Company. This material provides an impedance between conductors on opposite surfaces of approximately 50 ohms as desired for a typical application of the meter.

Figure 2:
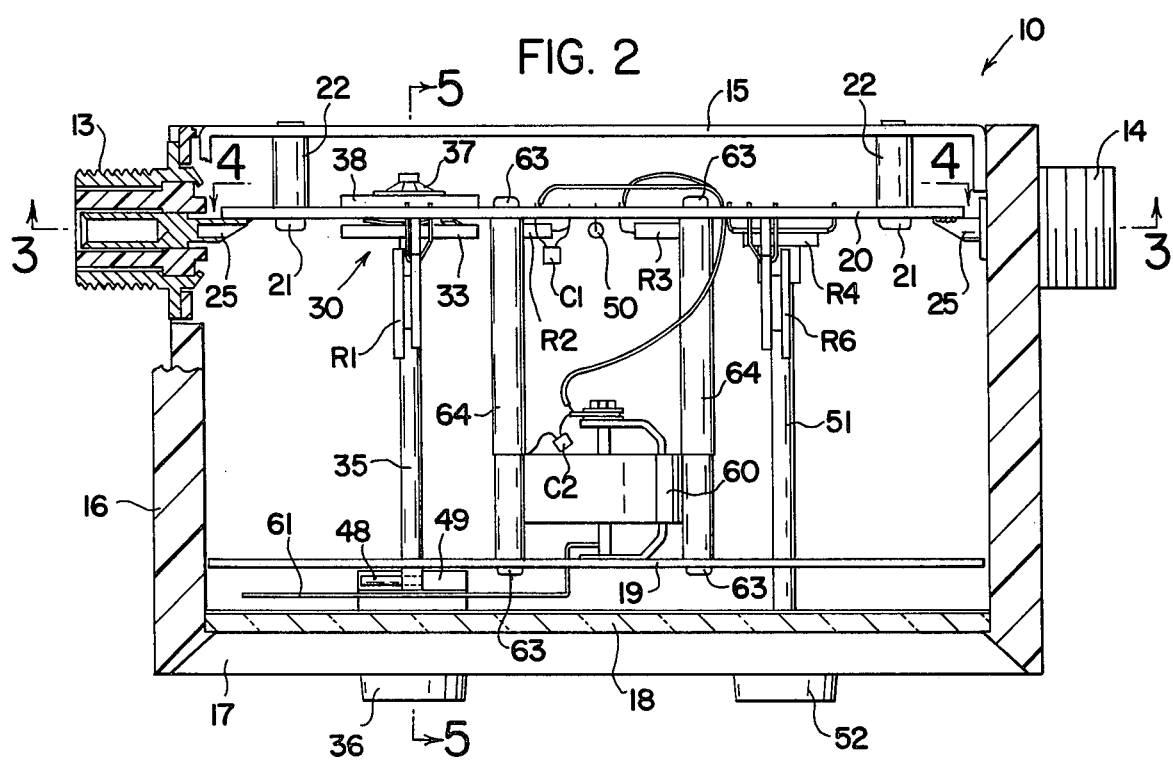
FIG. 2 is a sectional view on an enlarged scale with parts broken away, taken on the line 2—2 of FIG. 1.
Figure 3:
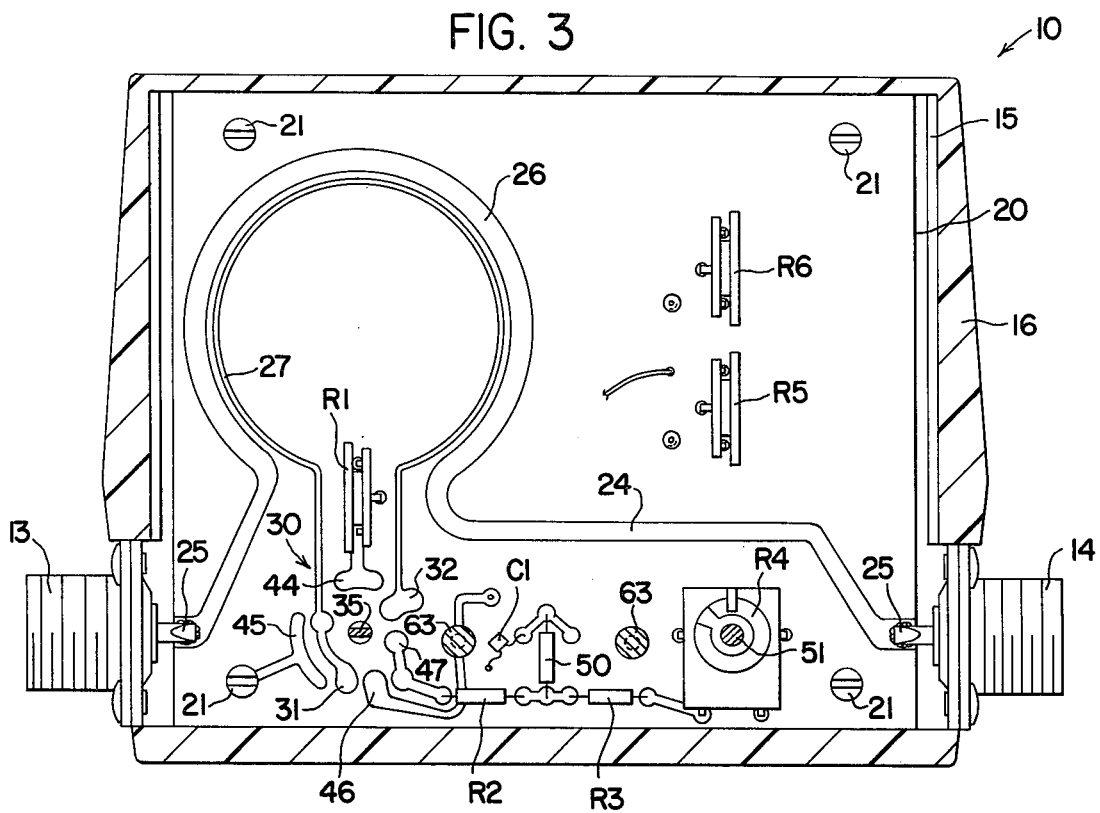
FIG. 3 is a sectional view taken on the line 3—3 of FIG. 2.
Figure 4:
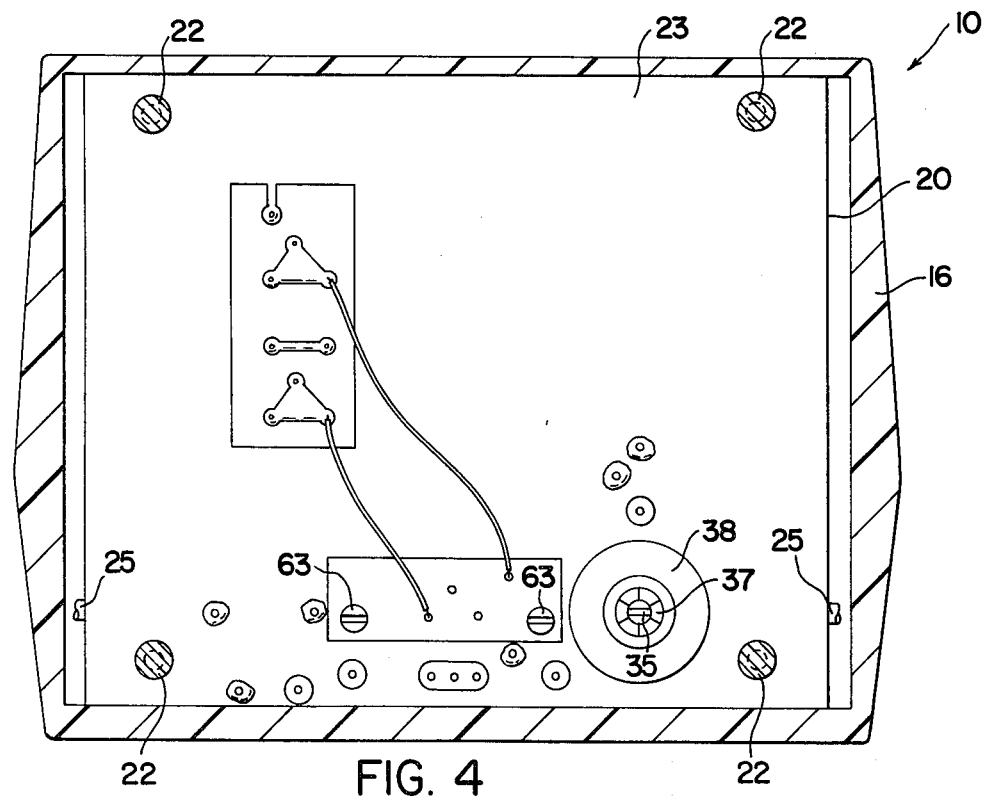
FIG. 4 is a sectional view taken the line 4—4 of FIG. 2.
Figure 8:
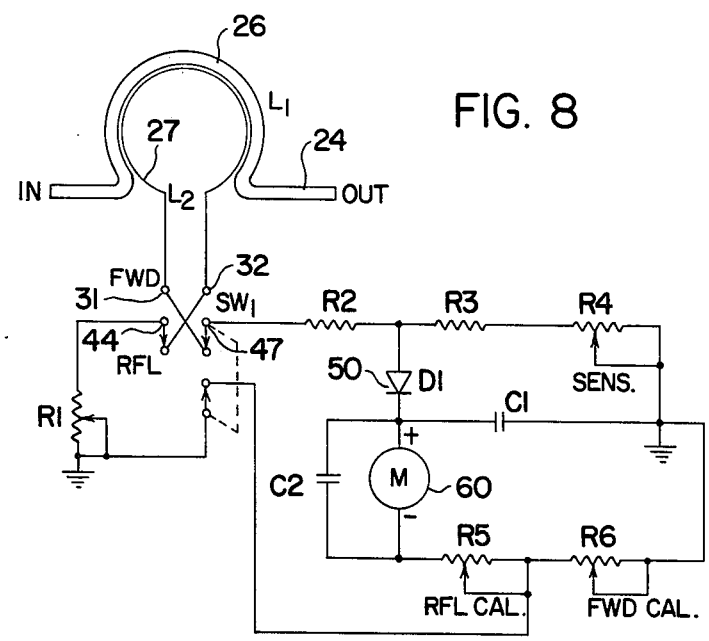
FIG. 8 is a view illustrating in diagrammatic form the electrical circuitry of the instrument of FIGS. 1-7, inclusive.

The microstrip board 20 is supported by the base 15 by means of machine screws 21 and spacer sleeves 22 that provide a ground connection to the base 15, which is, in turn, in electrical contact with the outer conductors of the coaxial connectors 13 and 14. Referring to FIGS. 2 and 4, the rearward surface of the circuit board 20 is coated with a ground plane conductor 23 in the pattern shown in FIG. 4. The opposite, or front, surface of the board 20 has a printed conductive path 24 coated thereon and communicating at its opposite ends with the coaxial center conductors of the coaxial connectors 13 and 14. Between the ends of the conductive path 24 is a circular loop portion 26, as indicated in FIGS. 3 and 8. Also printed on the front surface of the board 20 is a symmetrical inductive sensing loop 27 located within and concentric with the loop portion 26 of the conductive path 24, and closely spaced therefrom as shown in FIG. 3. The sensing loop 27 serves as a coupling element to sense the voltage wave signal (either forward or reflected) on the transmission line. The unique symmetry of the conductive path 24 and the sensing loop 27 make possible the generation of a signal of sufficient strength, through the inductive coupling of the loop 27 to the conductive path 24, to sense and measure the respective voltage standing waves.

Also printed on the front face of the circuit board 20 are contact zones forming part of a rotary switch assembly 30 used to electronically orient the loop 27 so as to sense either the forward voltage standing wave or the reflected standing voltage wave on the transmission line. The contact zones of the switch assembly 30 include two sensing loop terminals 31 and 32 located at opposite ends of the sensing loop 27.

The switch assembly 30 also includes a contact carrier disc 33, a switch shaft 35, a switch knob 36 (FIGS. 1 and 5) and a fastener element 37 pressed onto the inward end of the shaft 35 to hold the parts in place and a dielectric bearing plate 38 interposed between the rear surface of the circuit board 20 and the fastener 37.

The contact carrier disc 33 carries three contact arms, 41, 42 and 43, (FIG. 6) which serve to connect certain of the contact zones in accordance with the desired function. In addition to the loop terminals 31 and 32, there are also four other contact zones, 44, 45, 46 and 47, best shown in FIG. 3.

FIG. 6 shows the condition of the switch assembly 30 when in the "forward" position wherein the sensing loop 27 is electronically oriented to sense and measure the forward voltage standing wave on the transmission line. In this condition, the contact arm 41 connects the loop terminal 31 to the contact zone 44, the contact arm 42 connects the contact zone 45 to the contact zone 46. This is to provide greater sensitivity so low levels of VSWR can better be resolved. The contact arm 43 connects the loop terminal 32 to the contact zone 47.

When the knob 36 of switch assembly 30 is rotated 180° to its "reflected" position so that the sensing loop is electronically oriented to sense the reflected voltage standing wave on the transmission line, the contact arm 41 connects the loop terminal 31 to the contact zone 47, the contact arm 42 connects the loop terminal 32 to the contact zone 44, and the contact arm 43 in inactive.

Rotary movement of the switch assembly 30 is limited to a 180° range by means of a detent pin 48 (FIG. 7) which engages opposite sides of a stop bracket 49 attached to the housing 16.

The switch assembly 30 serves to connect the sensing loop 27 to a meter circuit between the sensing loop 27 and the D'Arsonval meter movement 60. The circuit components, best shown in schematic form in FIG. 8, include a rectifier diode 50 of the germanium crystal type, a sampling potentiometer R1 mounted on the circuit board 20 (FIGS. 2 and 3) and in electrical contact with the contact zone 44, a band broadening shunt condensor C1 and a series resistor R2 connected between the contact zone 47 and the rectifier diode 50. Also, there is a variable RF attenuator as described in U.S. patent application Ser. No. 738,476 and comprising the series resistor R2, a shunt resistor R3 and a scale expanding potentiometer R4. The potentiometer R4 is used to set the needle in the "forward" condition to the index mark on the VSWR scale in order to obtain the respective ratio when the switch knob 36 is thereafter rotated to the "reflected" position. The potentiometer is controlled by a shaft 51 (FIG. 2) with a knob 52 located on the front panel 17.

The meter circuit also includes a reflected mode calibration potentiometer R5 connected between the diode 50 and the negative terminal of the meter movement 60, a forward mode calibration potentiometer R6 and a fixed calibration resistor R7. The values and functions of the various resistive and capacitive circuit elements are given in Table I below.

TABLE I

| Circuit Element | Resistance (Ohms) | Function |
|---|---|---|
| R1 | 500 | Sampling Potentiometer |
| R2 | 150 | Series Resistor |
| R3 | 180 | Shunt Resistor |
| R4 | 2.5K | Scale Expanding Potentiometer |
| R5 | 1K | Calibration Potentiometer (RFL) |
| R6 | 5K | Calibration Potentiometer (FWD) |
| — | Capacitance (Microfarads) | — |
| C1 | 1000 | Shunt Condenser |
| C2 | 1000 | Charge Condenser |

The D'Arsonval meter movement 60 is commercially available under Model No. 7542524310 Weston has a pointer 61 which indicates on meter scale 62 printed on the meter scale plate 19. The meter movement which is of conventional design is connected to the printed circuit board by screws 63 and spacer sleeves 64 which, in turn, support the meter scale plate 19.

In operation, the meter 10 is inserted in the transmission line using the connectors 11 and 12, shown in phantom lines in FIG. 1, and power is supplied to the transmission line. The knob 36 is rotated to the "forward" position and the indication provided by the pointer 61 is observed and read on the respective scale shown on the meter scale plate 19. Then the control knob 52 mounted on the shaft 51 for the potentiometer R4 is rotated to bring the needle 19 to the right-hand limit of the VSWR scale or to the "set" position. Then the knob 36 is rotated 180° to the "reflected" position to sense the reflected voltage standing wave on a transmission line. The pointer 61 will then indicate the voltage standing wave ratio on the respective scale calibrated in increments between about 1.0 and 3.0. It will be noted that when the switch assembly 30 is in the "reflected" position, the contact arm 43 is in a shorted condition so that the circuit to the contact zones 45 and 46 is in a closed condition. This increases meter sensitivity to provide better resolution when measuring the reflected wave level.

The unique results thus achieved are accomplished by the novel circuit design printed on the microstrip circuit board 20 in accordance with the invention. This arrangement provides excellent reliability and consistent repeatability of meter readings throughout the rather narrow band for which the meter is specifically designed.

While the invention has been shown and described with respect to a specific embodiment thereof, it is intended for the purpose of illustration rather than limitation and other modifications and variations in the specific form herein shown and described will be apparent to those skilled in the art, all within the intended spirit and scope of the invention. Accordingly, the patent is not to be limited in scope and effect to the specific embodiment herein shown and described, nor in any other way that is inconsistent with the extent to which the progress in the art has been advanced by the invention.

I claim:

1. In an instrument for detecting and measuring directional RF voltage wave levels on a coaxial transmission line having a tubular outer conductor and a coaxial inner conductor, said instrument being adapted to be inserted in the line and having a D'Arsonval meter movement, the improvement which comprises:

a microstrip circuit board with a ground plane conductive layer on one surface in electrical contact with the ends of said tubular outer conductor and a conductive path printed on the other surface thereof connected to the ends of said coaxial inner conductor, said conductive path having a circular loop portion formed therein, an inductive sensing loop printed on said other surface within and coaxial with said loop portion of said conductive path and closely spaced thereto for sensing the RF voltage wave level on said transmission line, circuit means between said sensing loop and said meter movement to process the signal sensed by said sensing loop, and rotary switch means operationally associated with said microstrip circuit board and having a first position wherein said sensing loop is connected to said circuit means to sense the forward voltage wave on said transmission line and a second position wherein said sensing loop is connected to said circuit means to sense the reflected voltage wave on said transmission line.

2. An instrument as defined in claim 1 wherein said circular loop portion of said conductive path and said inductive sensing loop are symmetrical with one another.

3. An instrument as defined in claim 1 wherein said second position of said rotary switch means is located at 180° of rotation from said first position.

* * * * *